(12) United States Patent
Chien et al.

(10) Patent No.: US 8,453,043 B2
(45) Date of Patent: May 28, 2013

(54) BUILT-IN BIT ERROR RATE TEST CIRCUIT

(75) Inventors: Jinn-Yeh Chien, Chu Bei (TW); Chih-Hsien Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 323 days.

(21) Appl. No.: 12/880,960

(22) Filed: Sep. 13, 2010

(65) Prior Publication Data

US 2012/0066559 A1  Mar. 15, 2012

(51) Int. Cl.
*G06F 7/02* (2006.01)
*G06F 11/00* (2006.01)
*H03M 13/00* (2006.01)

(52) U.S. Cl.
USPC .......................................... 714/819; 714/704

(58) Field of Classification Search
USPC   714/704, 746, 819, 733; 324/76.82; 375/232, 375/221, 226
See application file for complete search history.

(56) References Cited

U.S. PATENT DOCUMENTS

| | | | |
|---|---|---|---|
| 5,793,822 A | 8/1998 | Anderson et al. | |
| 6,525,584 B2 | 2/2003 | Seo et al. | |
| 6,727,741 B2 | 4/2004 | Huang et al. | |
| 6,829,295 B2 * | 12/2004 | Chao et al. | 375/226 |
| 6,983,394 B1 * | 1/2006 | Morrison et al. | 713/500 |
| 7,715,514 B2 * | 5/2010 | Takeuchi | 375/375 |
| 7,791,330 B2 * | 9/2010 | Heidel et al. | 324/76.82 |
| 8,169,225 B2 * | 5/2012 | Schuttert | 324/555 |
| 8,228,972 B2 * | 7/2012 | Tonietto et al. | 375/221 |

OTHER PUBLICATIONS

Kossel et al., Jitter measurements of high speed serial links, 2004, IEEE, p. 536-543.*
Bushnell et al., A jitter reduction circuit using autocorrelation for phase locked loops and serializer deserializer (SERDES) circuits, 2008, IEEE, p. 581-588.*
Agilent Technologies, N4903B J-BERT High-Performance Serial BERT, "Complete Jitter Tolerance Test for Embedded and Forwarded Clock Devices," Mar. 22, 2010, 26 pages.

* cited by examiner

*Primary Examiner* — Shelly A Chase
(74) *Attorney, Agent, or Firm* — Slater & Matsil, L.L.P.

(57) ABSTRACT

System and method for testing jitter tolerance by using a built-in jitter modulation circuit is disclosed. An embodiment comprises a jitter modulation circuit, a transmitter, a receiver and a data comparison unit. The jitter modulation circuit includes a plurality of data latches, a phase-select block and a multi-phase clock generator. The multi-phase clock generator is capable of generating a plurality of signals having different phase shifts wherein one signal having a phase shift from the system clock signal is selected by the phase-select block. The selected signal alters the data by injecting jitter through a plurality of data latches. The jitter-contaminated data is transmitted to a data comparison unit through a transmitter and a receiver. The on-chip test circuit compares the jitter-contaminated data with the original data and calculates the bit error rate so as to determine whether the jitter tolerance of this semiconductor device satisfies the specification.

20 Claims, 13 Drawing Sheets

BUILT-IN BIT ERROR RATE TEST CIRCUIT

BACKGROUND

Data rates in modern integrated circuits can reach 5 gigabits per second and beyond. At these data rates, jitter can become a significant issue for some products such as products compliant with the Peripheral Component Interconnect (PCI) Express standard, as well as others. Many standards define tests and set limits for jitter at a certain bit error rate (BER). More specifically, jitter tolerance can be evaluated by measuring BER. In PCI Express, for example, a typical BER having an order of $10^{-12}$ is acceptable. Conventionally, measuring BER typically requires specially designed test equipment.

BRIEF DESCRIPTION OF THE DRAWINGS

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a built-in self-test bit error rate tester. The invention may also be applied, however, to other electronic devices exhibiting analogous characteristics to the semiconductor device disclosed herein. It should be clear to those experienced in the art that the present invention can be applied and extended without deviating from the scope of the present invention.

Figure 1:
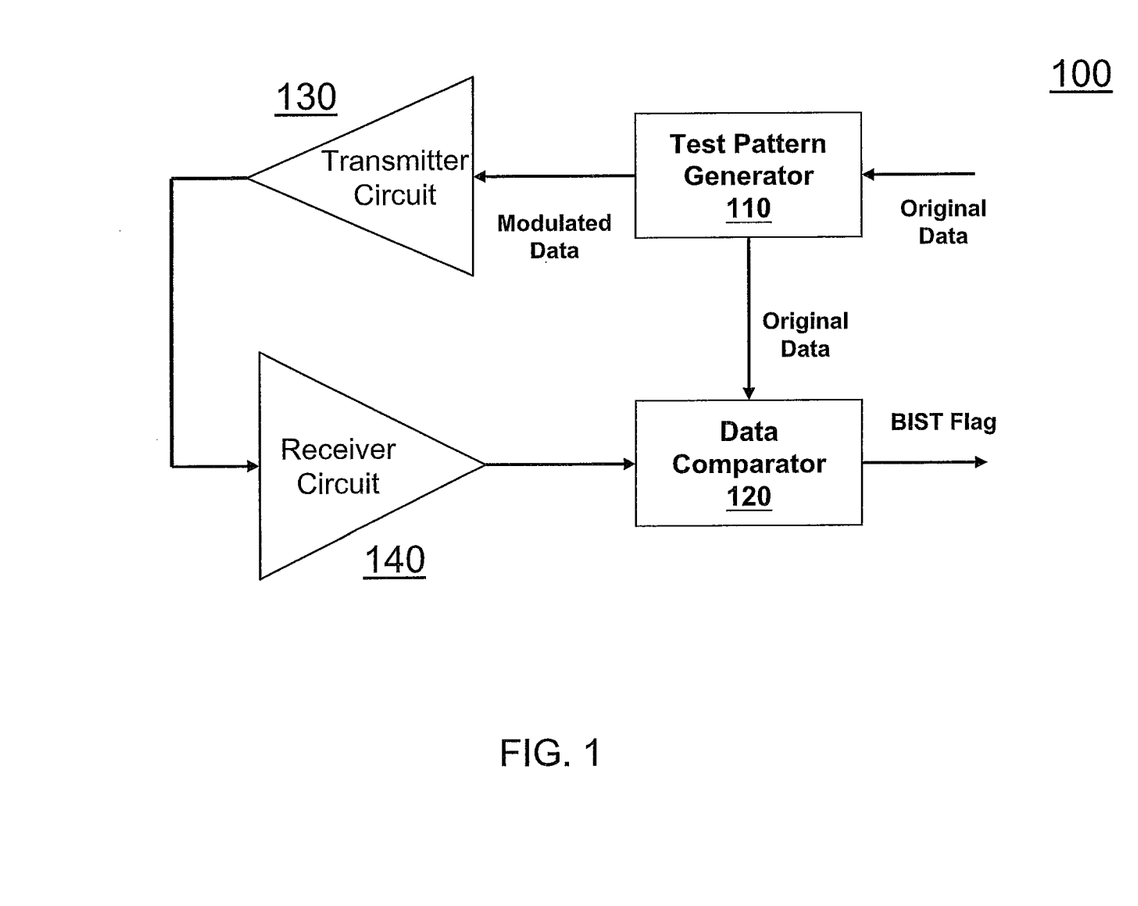
FIG. 1 illustrates a high level view of a built-in self-test bit error rate tester according to an embodiment.

FIG. 1 shows a high level view of a first embodiment. In FIG. 1, an input data signal is sent to a test pattern generator 110, which includes a jitter modulation circuit 210 shown in FIG. 2 and a path providing a channel for the data signal to reach one input of a data comparator 120. The jitter-altered data signal from the test pattern generator 110 is sent to another input of the data comparator 120 via a transmitter circuit 130 and a receiver circuit 140. The comparator 120 compares the two inputs and sends a flag if the error rate exceeds a BER limit.

Figure 2:
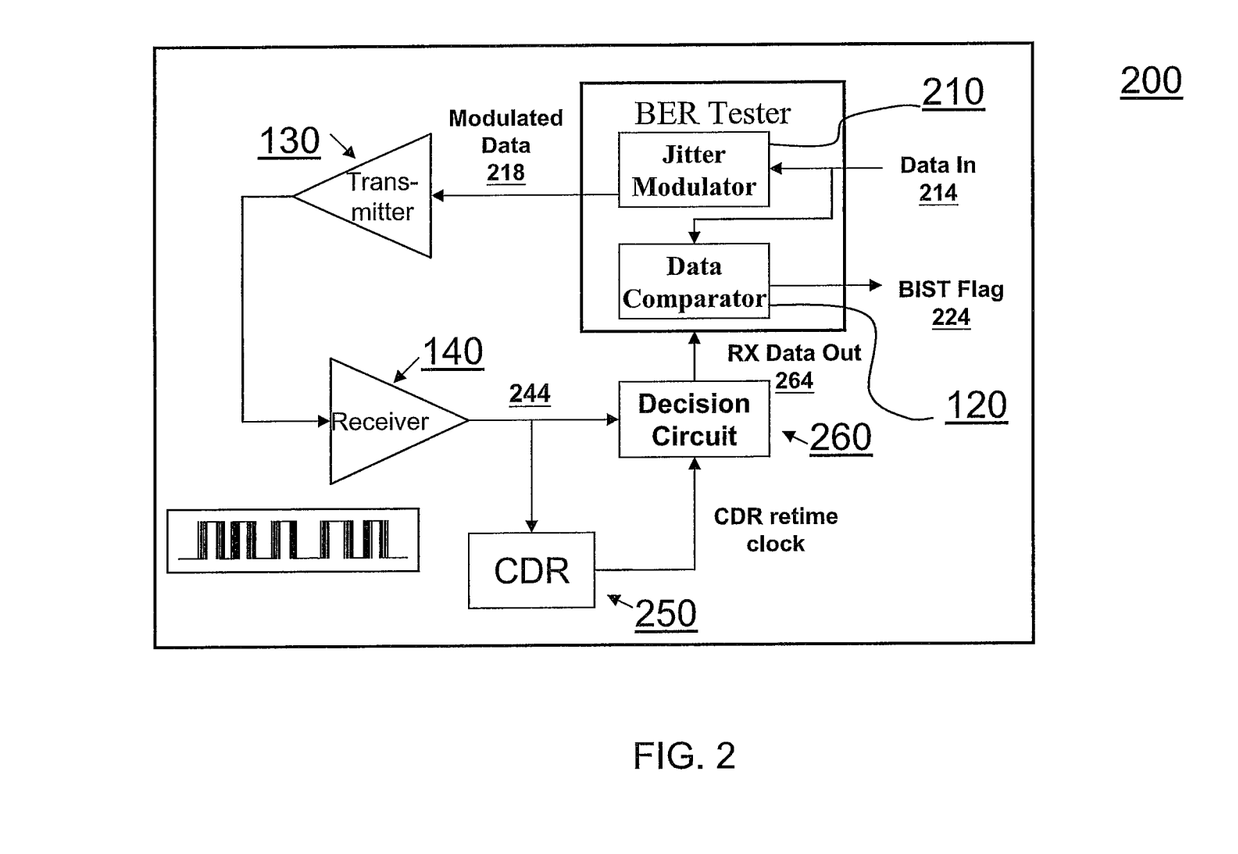
FIG. 2 illustrates a block diagram of the built-in self-test bit error rate tester shown in FIG. 1.

Referring next to FIG. 2, a first embodiment is illustrated. A novel built-in self-test circuit for testing bit error rate (BER) in an integrated circuit device 200 is disclosed. The integrated circuit device 200 comprises, first, the jitter modulator unit 210. The jitter modulator unit 210 generates a modulated output signal 218 in response to an input data signal 214. The modulated output signal 218 is altered from the data input signal 214 by going through the jitter modulator unit 210. Second, the integrated circuit device 200 also comprises the transmitter circuit 130. The transmitter circuit 130 receives the modulated data signal 218 and functions as an input/output (I/O) stage to amplify it to an appropriate large signal. The transmitter 130 is coupled to the receiver 140 using a transmission medium. The receiver 140 functions as a buffer stage to convert the large signal to a small signal 244. The small signal 244 is fed into a clock data recovery (CDR) unit 250 and a decision circuit 260. The CDR unit 250 is used to extract the clock or timing information from the small signal 244 so that the decision circuit 260 driven by the extracted clock can retime the data contained within small signal 244 and square up the pulses, which may have blunt leading and trailing edges after the data travels through the transmission medium. The data comparator unit 120 compares the input data signal 214 and the output signal 264 from the decision circuit 260 and sends a built-in self-test flag 224 when the data comparator unit 120 determines unacceptable errors have occurred in response to an alteration of the transmitted data caused by the jitter modulation unit 210. An advantageous feature of the described embodiment is that the entire built-in self-test circuit is contained within the integrated circuit.

Figure 3:
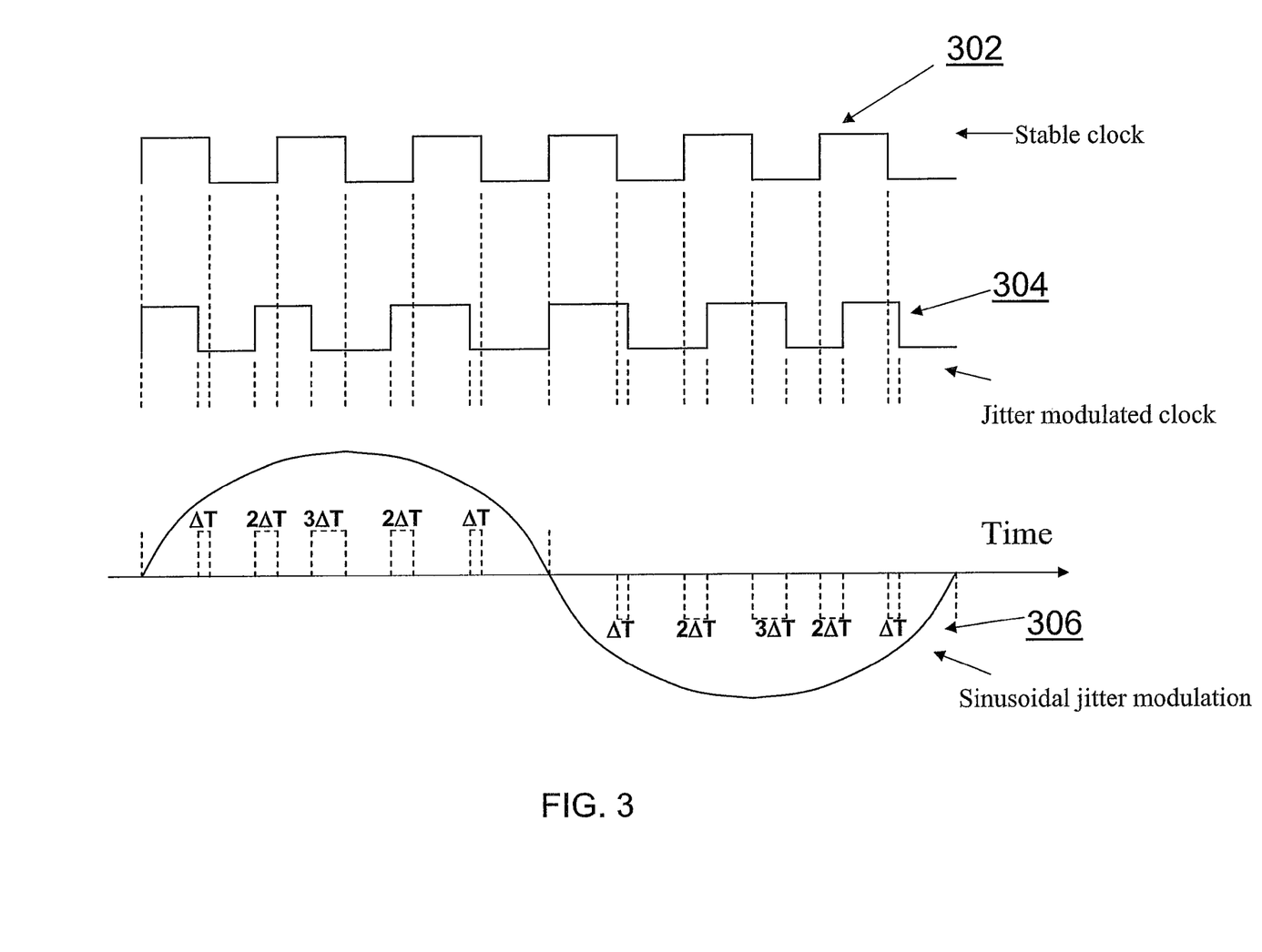
FIG. 3 illustrates a timing diagram of sinusoidal jitter modulation.
Figure 4:
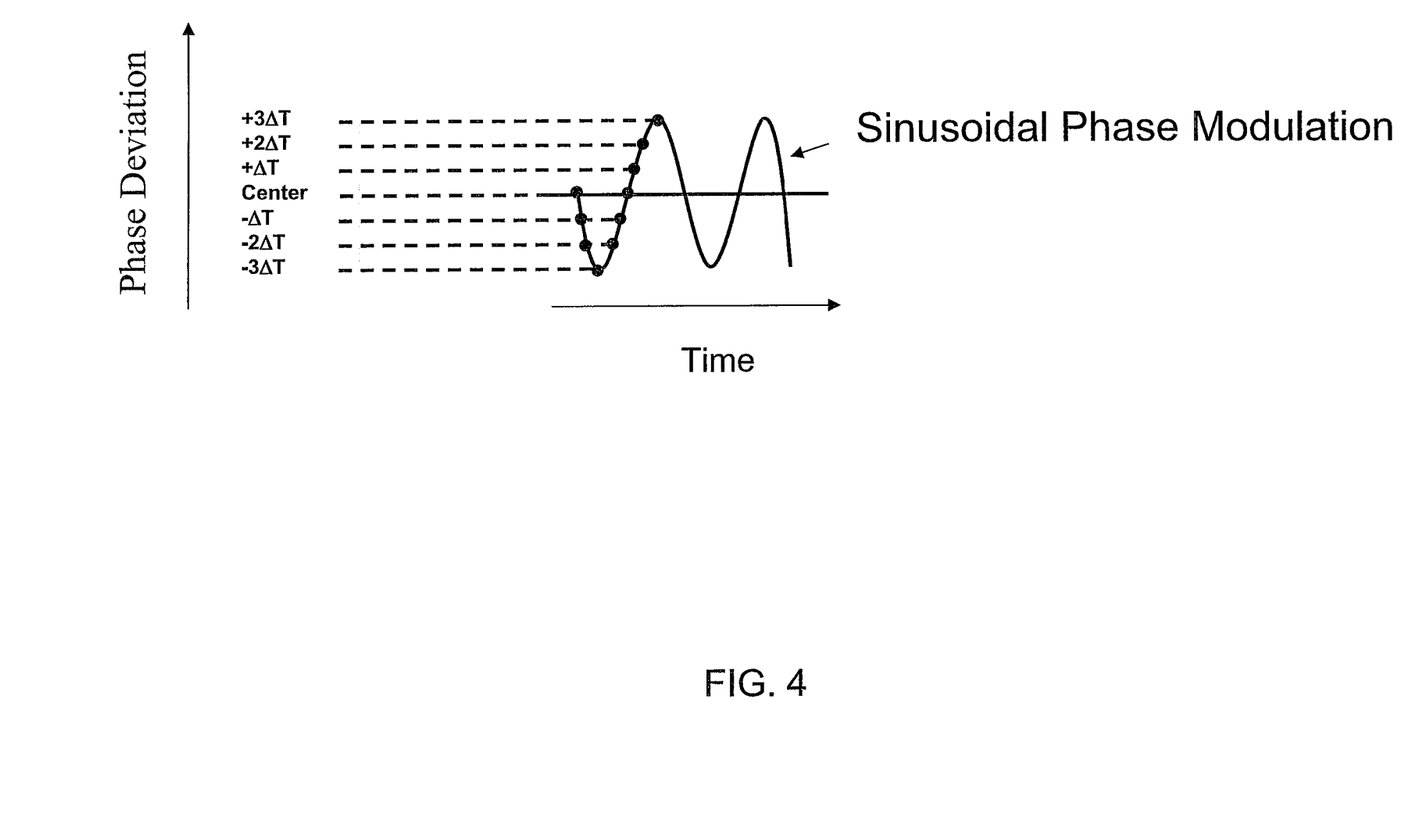
FIG. 4 illustrates phase deviation in proportion to the amplitude of a sine wave.

Referring to FIG. 3, timing diagram 302 illustrates a stable clock and timing diagram 304 illustrates a jitter modulated clock, both in the time domain. The phase of the jitter modulated clock periodically shifts about the stable reference clock 302. The time domain phase differences shown in dashed lines clearly illustrate the deviation of the jitter clock 304 from the stable clock 302. In each cycle, the peak phase deviation between the jitter clock and the stable clock is varied in proportion to the amplitude of a sinusoidal jitter modulation waveform 306 whereas a stable clock's phase is directly proportional to time. In other words, the phase of a stable clock and time vary in such a way that they have a constant ratio. In contrast, a jitter modulated clock's phase deviates from the stable clock line. The deviation of the phase constitutes a sinusoidal envelope as shown by curve 360. FIG. 4 depicts an example of sinusoidal phase modulation, such as employed in certain of the disclosed embodiments.

In FIG. 4, the horizontal axis is time. The vertical axis represents phase deviation. In this figure, the phase deviation is varied in proportion to the amplitude of the sine wave. For example, when the sinusoidal phase modulation waveform reaches its positive peak, the corresponding phase deviation in the time domain is 3 ΔT, wherein ΔT represents a time interval in the time domain. Likewise, the phase deviation between a jitter modulated clock and a stable clock is −3 ΔT when the reference sinusoidal waveform reaches its negative peak. Similarly, there is no phase difference when the sinusoidal waveform crosses the zero line of the plot.

Figure 5:
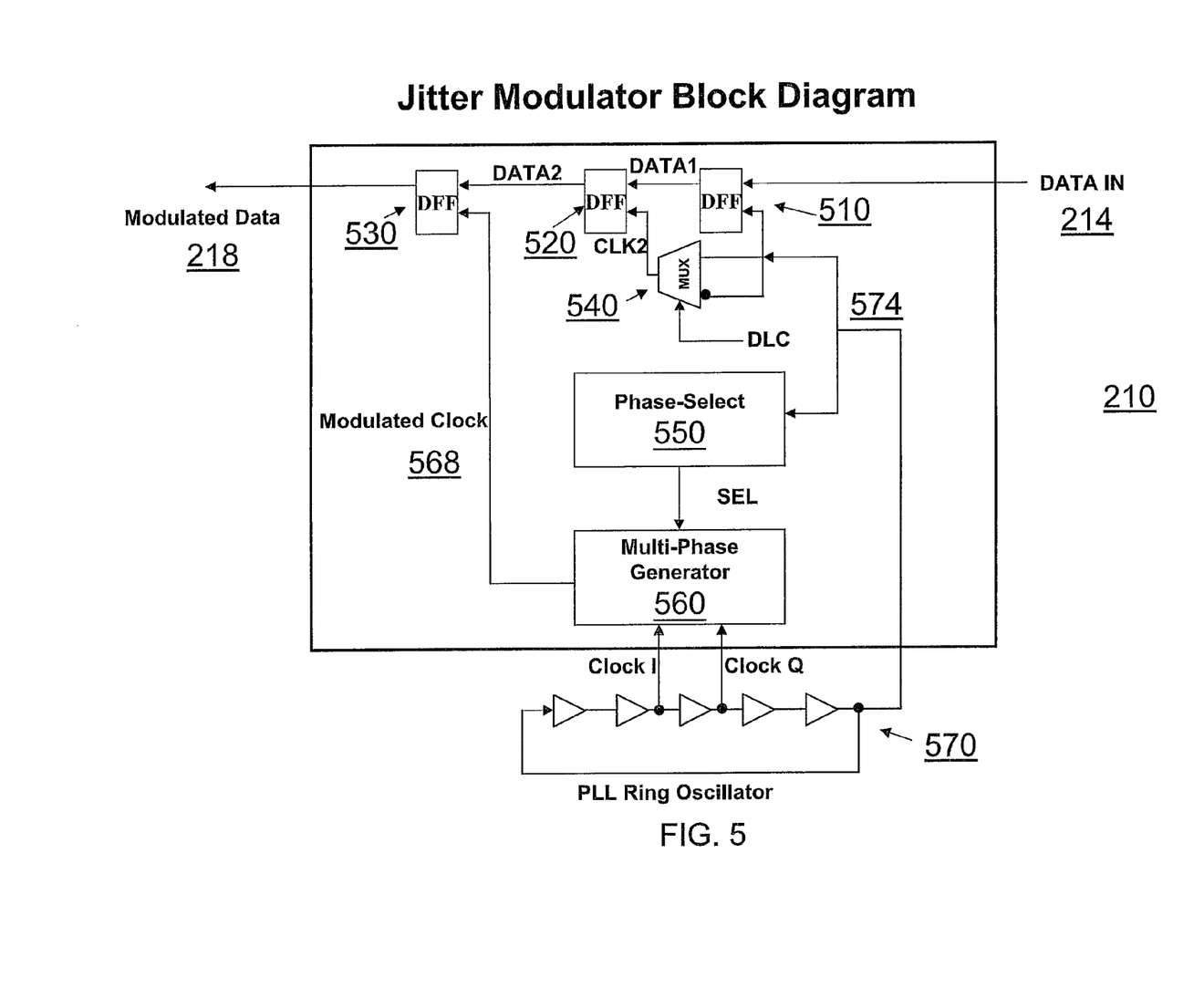
FIG. 5 illustrates a block diagram of a jitter modulation unit.

Referring to FIG. 5, the jitter modulator unit 210 depicted in FIG. 2 is illustrated in further detail. The jitter modulator unit 210 includes a first data latch 510 having a signal input for receiving the data signal 214, a clock input for receiving a clock signal from a system clock 574 and an output DATA1. The jitter modulator unit 210 also comprises a second data latch 520 having a signal input for receiving DATA1 from the output of the first data latch 510, a clock input for receiving a clock signal CLK2 from a multiplexer 540 and an output for generating a phase modulated output signal DATA2.

The phase modulated output signal DATA2 has a 180-degree phase shift from the input signal DATA1 of the second data latch 520 when the clock signal CLK2 from the multiplexer 540 has a 180-degree phase shift from the system clock 574. This happens when a DLC signal has a logic state of "1", which indicates that the system is under a jitter tolerance test. On the other hand, when the DLC signal has a logic state of "0", the system is in a normal operation and the multiplexer 540 selects the system clock 574 and sends it to the clock input of the DFF 520. Accordingly, the output signal DATA2 is in phase with the input signal DATA1 since the clock signal CLK2 from the multiplexer 540 is in phase with the system clock 574.

The jitter modulator unit 210 further comprises a third data latch 530 having a signal input for receiving the data signal DATA2 from the output of the second data latch 520, a clock input for receiving a phase-shifted clock signal 568 with the phase modulated by a multi-phase clock generator 560 and an output. The third data latch 530 generates a phase modulated output signal 218 wherein the phase modulated output signal is in phase with the phase-shifted clock signal 568 of the third data latch 530.

The multiplexer 540 has two data inputs and a control input. The first data input of the multiplexer receives the system clock 574 directly. The second data input of the multiplexer receives a clock signal having a 180-degree phase shift from the system clock 574. The control input receives a data latch control signal DLC from the system. As described above, the logic state of the DLC indicates whether the system is under a jitter tolerance test. The multiplexer 540 selects either the first input signal (system clock 574) or the second input signal (180-degree phase shifted clock) depending on the state of the data latch control signal DLC and transfers the selected input signal to the output as signal CLK2. CLK2 is coupled to the clock input of the second latch 520, as described above.

The jitter modulator unit 210 further comprises a PLL ring oscillator 570 having five gates attached in a chain wherein the output of the last gate is fed back into the input of the first gate. Two gates' outputs from the PLL ring oscillator are coupled to the multi-phase clock generator and the last gate's output from the PLL ring oscillator is used as the system clock 574. One skilled in the art will recognize that a PLL is simply one manner of generating clock signals and that other and alternate embodiment PLLs could be employed (such as employing a different number of gates and taps) and that other circuits, (e.g., a voltage controlled oscillator, a delay locked loop, etc.) could be employed for this function.

The multi-phase clock generator 560 has two inputs receiving two clock signals from the PLL ring oscillator 570, a control signal input SEL from a phase-select block 550, and an output coupled to the clock input of the third data latch 530. The jitter modulator unit further comprises the phase-select block 550 having an input receiving the system clock 574 and an output SEL. The output, SEL, is coupled to the control signal input of the multi-phase clock generator 560.

Figure 6:
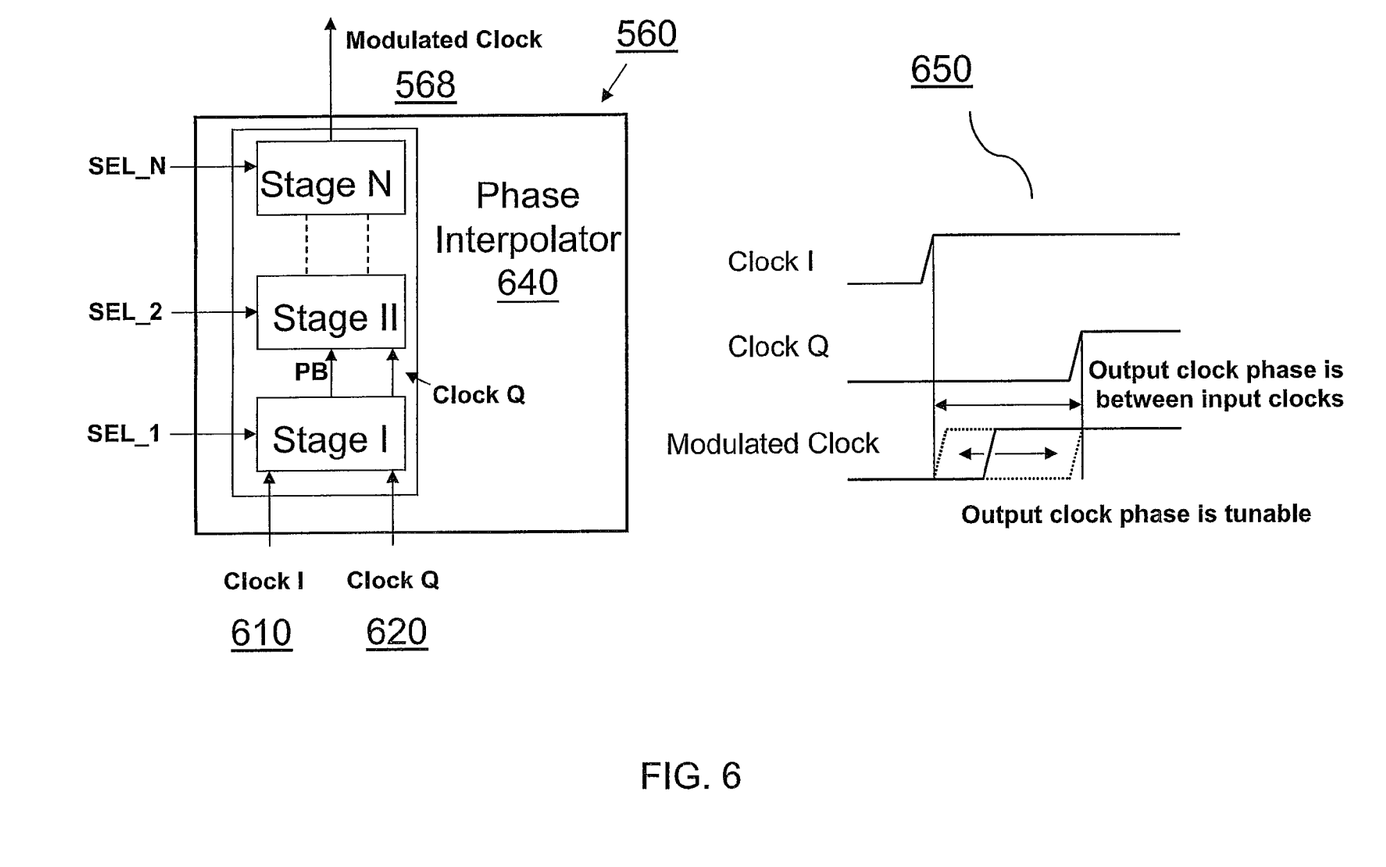
FIG. 6 illustrates a block diagram of a phase interpolator and a corresponding waveform diagram of input signals and the output signal from the phase interpolator.

A variety of techniques can be used to construct a multi-phase clock generator. FIG. 6 provides a block diagram to illustrate the operation of the multi-phase clock generator 560 in a specific way, namely a phase interpolator based multi-phase clock generator. In FIG. 6, Clock I 610 and Clock Q 620 represent two input signals of the multi-phase clock generator 560. Modulated clock 568 is the result of a phase blending signal as described below. The phase interpolator 640 may have several serially-connected phase-select stages, Stage I, Stage II . . . Stage N. The first phase interpolator stage (Stage I) sets a phase blending signal PB to the middle point between two input signals (in this case, Clock I 610 and Clock Q 620). In accordance with the control signal SEL of FIG. 5, one of the input signals (in this case, Clock Q 620) and the phase blending signal PB are selected and sent to the inputs of the next phase interpolator stage. The second stage (Stage II) repeats the same phase blending and selection process as the first stage. After several stages, the phase interpolator is capable of setting the output clock 568 to an intermediate point between two inputs Clock I 610 and Clock Q 620. That is, in the time domain, the modulated clock 568 has a rising edge located between Clock I 610 and Clock Q 620's rising edges. In FIG. 6, 650 is a detailed timing diagram illustrating the relationship among Clock I 610, Clock Q 620 and modulated clock 568.

Figure 7:
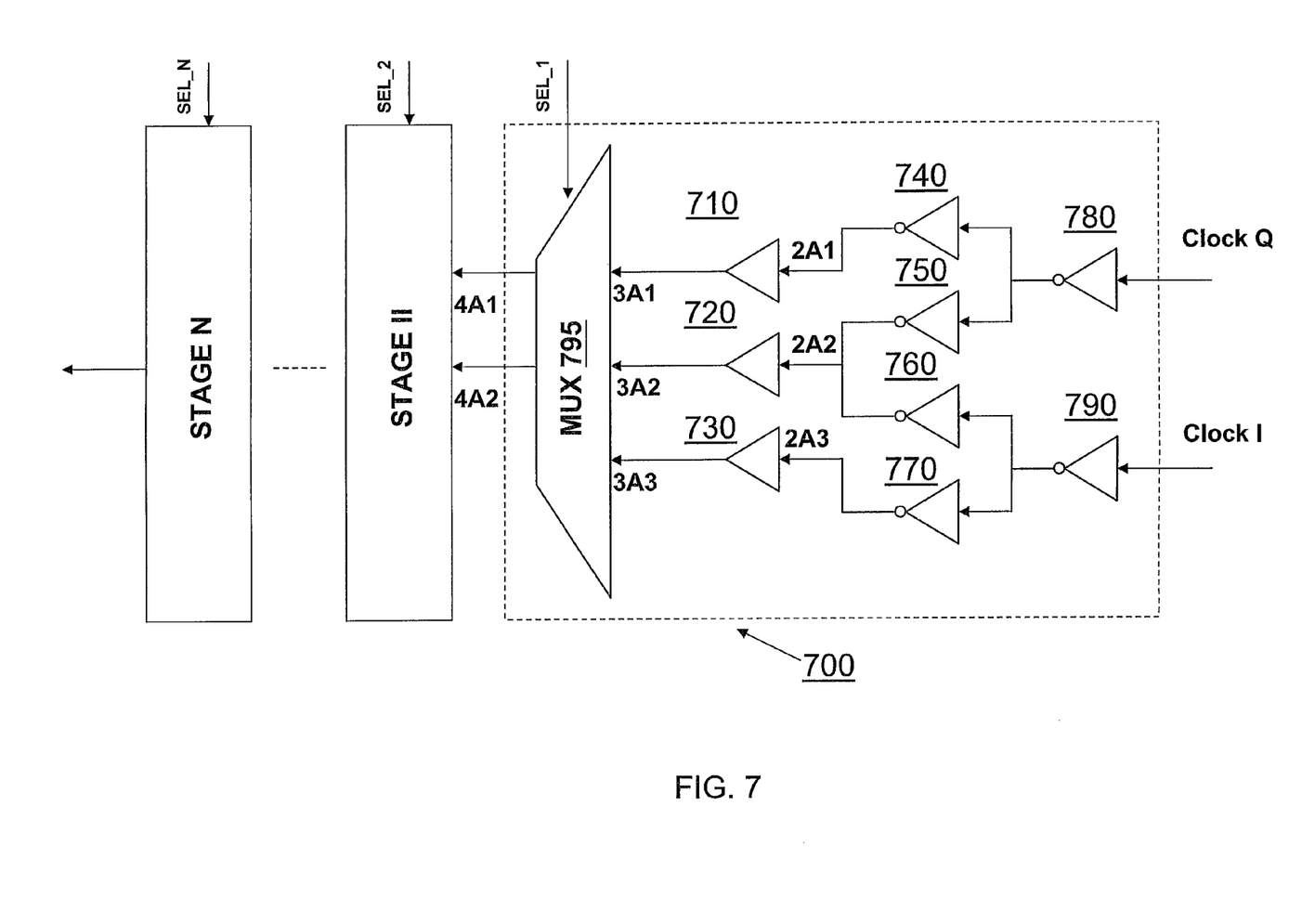
FIG. 7 illustrates a detailed circuit diagram of a phase interpolator shown in FIG. 6.

Turning to FIG. 7, a detailed block diagram of the first stage of the phase interpolator of FIG. 6 is depicted to illustrate the phase blending process. The second and other subsequent stages have the same configuration as the first stage even though not specially shown in detail. The first stage includes inverters 780, 790, 740, 750, 760 and 770. It also includes buffers 710, 720, 730, a multiplexer 795 and a selection signal SEL sent from the phase-select unit 550 in FIG. 5.

The inverters 780, 790 invert the input signals Clock Q and Clock I respectively, sent from the PLL ring oscillator unit 570 of FIG. 5. The inverter 780 sends its output signal to the downstream inverters 740 and 750. Likewise, the inverter 790 sends its output signal to the downstream inverters 760 and 770. The outputs of inverters 740 and 770 are in phase with the input signals Clock I and Clock Q respectively. The outputs of inverters 750 and 760 are blended together by tying the two outputs together. Consequently, inverters 750 and 760 constitute a phase blender and generate a phase-shifted signal 2A2 having an intermediate phase between other two output signals 2A1 and 2A3. Buffer 720 shapes the phase blending signal 2A2 and outputs a clean square wave signal having a sharp rising edge. Both buffers 710 and 730 are used to create an intentional delay to match the delay from buffer 720 so that all three output signals 3A1, 3A2 and 3A3 have the same propagation delay. Ideally, the phase interpolator sets output 3A2 to a middle point between outputs 3A1 and 3A3. Multiplexer 795 transfers the phase-shifted signal 3A2 to one of its outputs where it is called 4A2 to indicate that the signal is an input signal for the next stage. Moreover, multiplexer 795 generates the output signals 4A1 by selecting one of two output signals from buffers 710 and 730 in response to the selection signal SEL_1. In this case, 3A1 is selected and transferred to the output of multiplexer 795 where it is called 4A1.

The two output signals 4A1 and 4A2 from multiplexer 795 are sent to the next phase interpolator stage, in which the same circuit configuration repeats the same phase blending process and selects two output signals in response to the selection signal SEL_2. After repeating this phase blending scheme several times, by giving an appropriate control signal for each stage, the phase interpolator can generate a modulated signal having a phase falling into any point between two original input signals Clock I and Clock Q. At the last stage, only one signal is selected and fed into the clock input of the third data latch 510 in FIG. 5.

Figure 8:
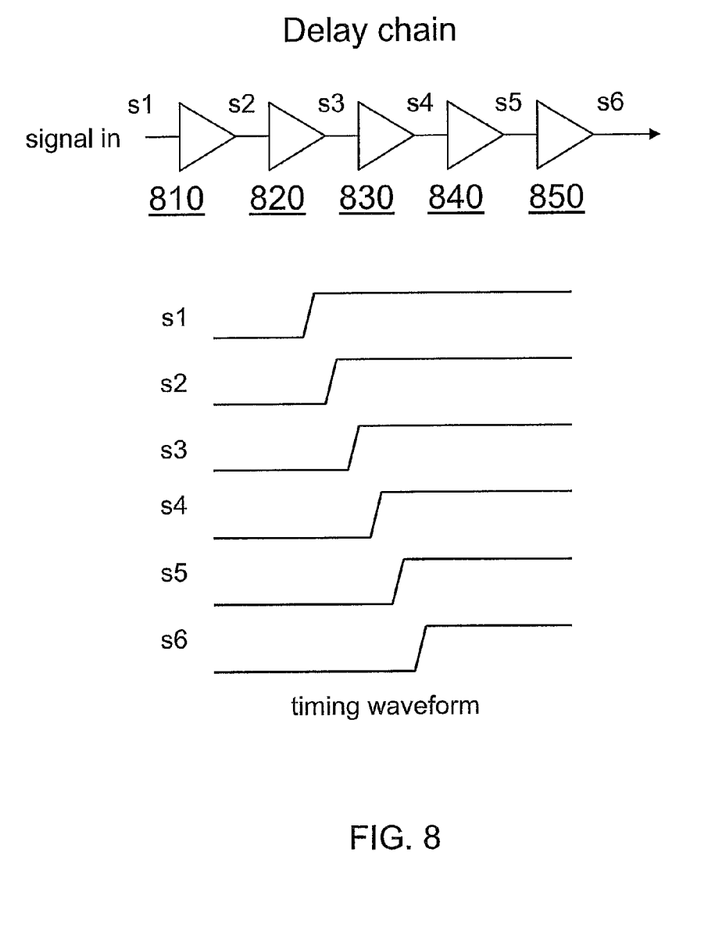
FIG. 8 illustrates a block diagram of a delay chain and a corresponding waveform timing diagram of input and output signals from the delay chain.

In the embodiment described above, the multi-phase clock generator 560 is built by using a phase interpolator illustrated in FIG. 7. Alternatively, FIG. 8 illustrates an example of using a delay chain to generate multi-phase clock signals. In FIG. 8, the delay chain includes five buffers 810, 820, 830, 840 and 850. Each buffer adds a propagation delay at its output signal in respect to its input signal. As illustrated in the timing diagram, the first delay cell 810 delays the input signal S1 for a delay period. Likewise, other delay cells have the same configuration as the first delay cell 810 and delay their respective input signals for another delay period. By using this delay chain, a plurality of signals having different phases can be generated by tapping off at various points in the delay chain. In response to a selection signal, the multi-phase clock generator generates a modulated signal having a phase difference from the input signal and sends it to the clock input of the third data latch 510 in FIG. 5. One skilled in the art will recognize that the delay chain illustrated in FIG. 8 is simply one embodiment and that other configurations for a delay chain, including differing numbers of delay elements and tap locations, can be employed.

Figure 9:
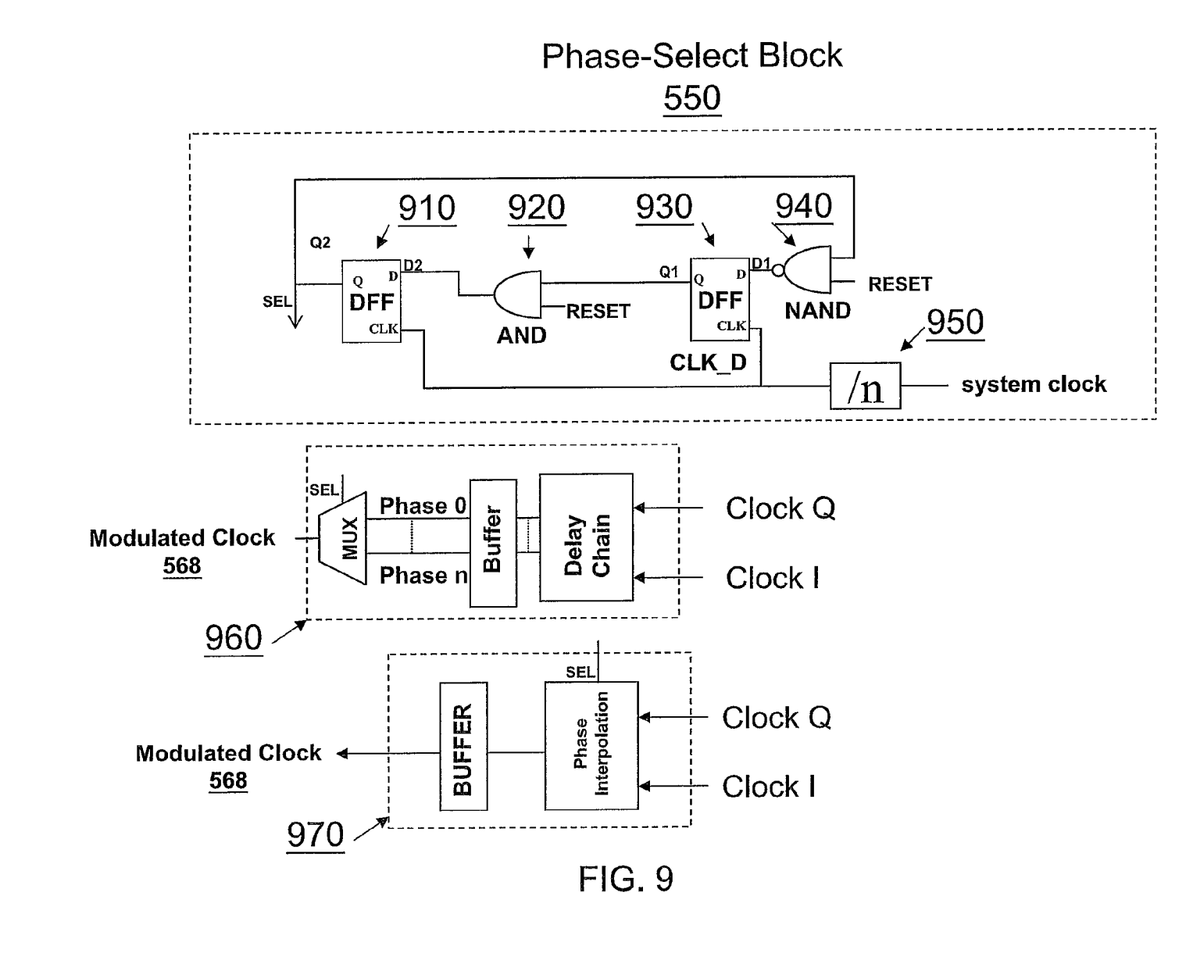
FIG. 9 illustrates a detailed circuit diagram of a phase-select finite-state-machine unit shown in FIG. 5, a delay chain based multi-phase clock generator and a phase interpolator based multi-phase clock generator.

Referring to FIG. 9, a block diagram of the phase-select block 550 of FIG. 5 is depicted. In the illustrated embodiment, phase-select block 550 is configured as a finite-state-machine. The output of the finite-state-machine SEL is used as a selection signal for the multi-phase clock generator 560. The multi-phase clock generator 560 can be built by a delay chain 960. Alternatively, a phase interpolator 970 can be used to generate multi-phase clock signals. In this embodiment, phase-select block 550 includes D flip-flop 910, AND gate 920, D flip-flop 930, NAND gate 940 and clock divider 950. The system clock signal 574 shown in FIG. 5 is received by clock divider 950, which divides the system clock frequency by N and generates a slow clock signal CLK_D from the fast system clock. The output from clock divider 950 is used as the clock signal for D flip-flop 910 and D flip-flop 930. NAND gate 940 has one input for receiving a RESET signal and another input for receiving signal Q2 from the output of D flip-flop 910. The data input of D flip-flop 930 is coupled to the output of NAND gate 940. AND gate 920 has one input for receiving a RESET signal and another input for receiving signal Q1 from the output of D flip-flop 930. The output of AND gate 920 is sent to the data input of D flip-flop 910.

Figure 10:
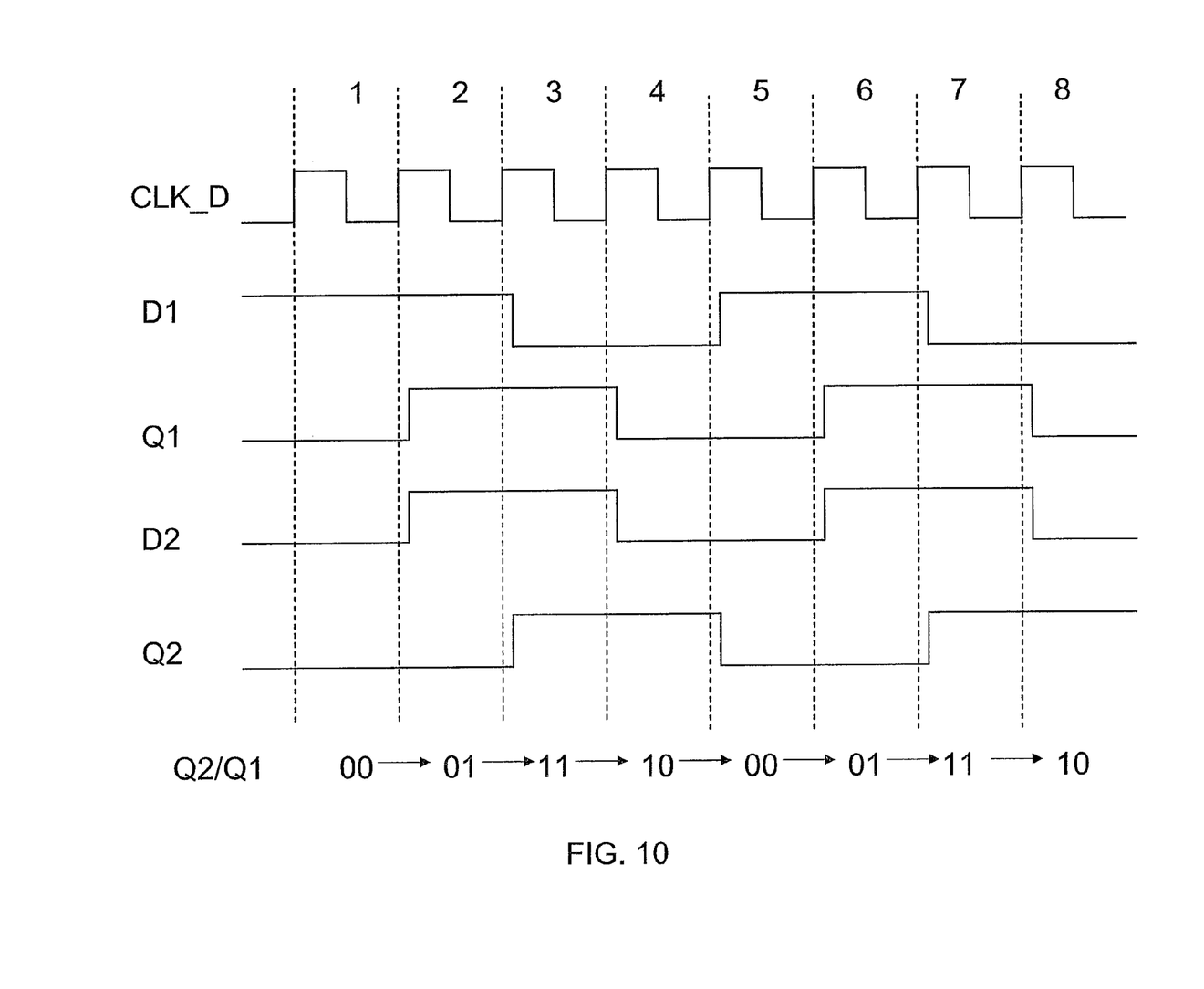
FIG. 10 illustrates the wave forms including the clock, D1, Q1, D2 and Q2 shown in FIG. 9.

D flip-flops 910 and 930 and logic gates 920 and 940 serve as a finite state machine. The finite state machine consists of both the combinational logic components such as gates and sequential components such as flip-flops. D flip-flops are chosen for their simplicity in design. The truth table of the D flip flop is well-known in the art. In accordance with the operation truth table of the D flip flop, the input of the D flip flop transfers to its output during the rising edge of its clock. Other configurations of sequential components are also within the contemplated scope of the invention as are other configurations and types of combinational logic. FIG. 10 gives an example to illustrate the basic operation of this state machine.

Turning next to FIG. 10, the outputs of D flip-flops 910 and 930 change their respective logic states with a short delay in response to the rising edge of CLK_D. Logic gates 920 and 940 work as a buffer and an inverter respectively. The output of AND gate 920 is in phase with the output of D flip-flop 930. The output of NAND gate 940 has a 180-degree phase shift from the output of D flip-flop 910.

FIG. 10 provides an example of cyclic codes generated by the finite state machine illustrated in FIG. 9. Assume that the cyclic code starts from "00". That is, both D flip-flops 910 and 930's outputs (Q2 and Q1) are at an initial value of "0". As a result, the data input of DFF 930 (D1) is logic high because NAND gate 940 functions as an inverter; the data input of DFF 910 (D2) is logic low because AND gate 920 functions as a buffer block. This corresponds to the time period "1" in FIG. 10. When a next rising edge of CLK_D occurs, within a short delay DFF 930 latches the logic high state according to the operation truth table of D flip-flip. Similarly, DFF 910 latches the logic low state. The output of DFF 930 (Q1) and the output of DFF 910 (Q2) remain high and low respectively until the next rising edge of CLK_D occurs. At the same time, in response to the logic state changes at 930 and 910's outputs, the data input of DFF 930 (D1) receives a logic high inverted from the output of DFF 910. Similarly the data input of 910 (D2) receives a logic high from the output of DFF 930 through AND gate 920. In short, after the first rising edge, D1, Q1, D2 and Q2's logic states are high, high, high and low respectively. This responds to the time period "2" in FIG. 10. In accordance with the operation truth table of D flip-flop, after four CLK_D clock cycles, the logic states of D1, Q1, D2 and Q2 are the same as the initial logic states of the first CLK_D clock. Hence, DFF 930, AND gate 920, DFF 910 and NAND gate 940 constitute a cyclic code generator, which is depicted in FIG. 11.

Figure 11:
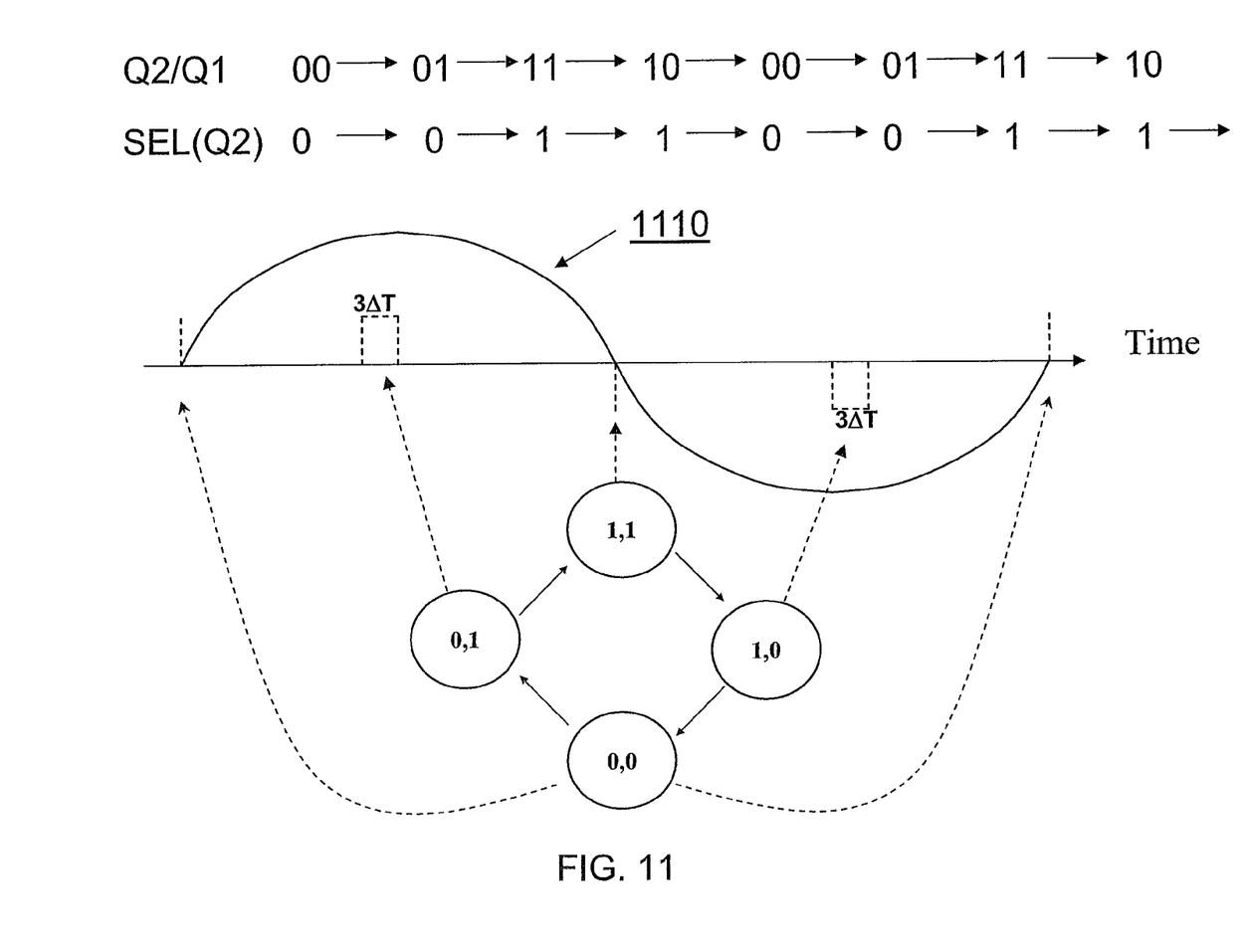
FIG. 11 illustrates the state transition of the two-bit finite state machine shown in FIG. 10.

In FIG. 11, a state machine diagram is used to summarize the state transitions at Q1 and Q2 of FIG. 10. If a counter is used to count the logic states of DFF 930 and DFF 910, the initial value of the counter is "00", which reflects the logic states of DFF 930 and DFF 910 during the first clock cycle. The counter starts from "00" and counts "01", "10" and "11", and returns to "00" and repeats. The state transition diagram including these four nodes is shown in FIG. 11. As shown in FIG. 9, SEL (Q2) is sent to the control input of either a phase interpolator 970 or a delay chain 960 to select a signal from a plurality of signals. In accordance with each logic state of the counter, a different phase shift is added into the data signal. For example, in a two-bit finite state machine as shown in FIG. 9, there are four different logic states available, namely "00", "01", "11" and "10". As illustrated in FIG. 11, each logic state corresponds to a different phase shift shown in the jitter modulation waveform 1110.

Figure 12:
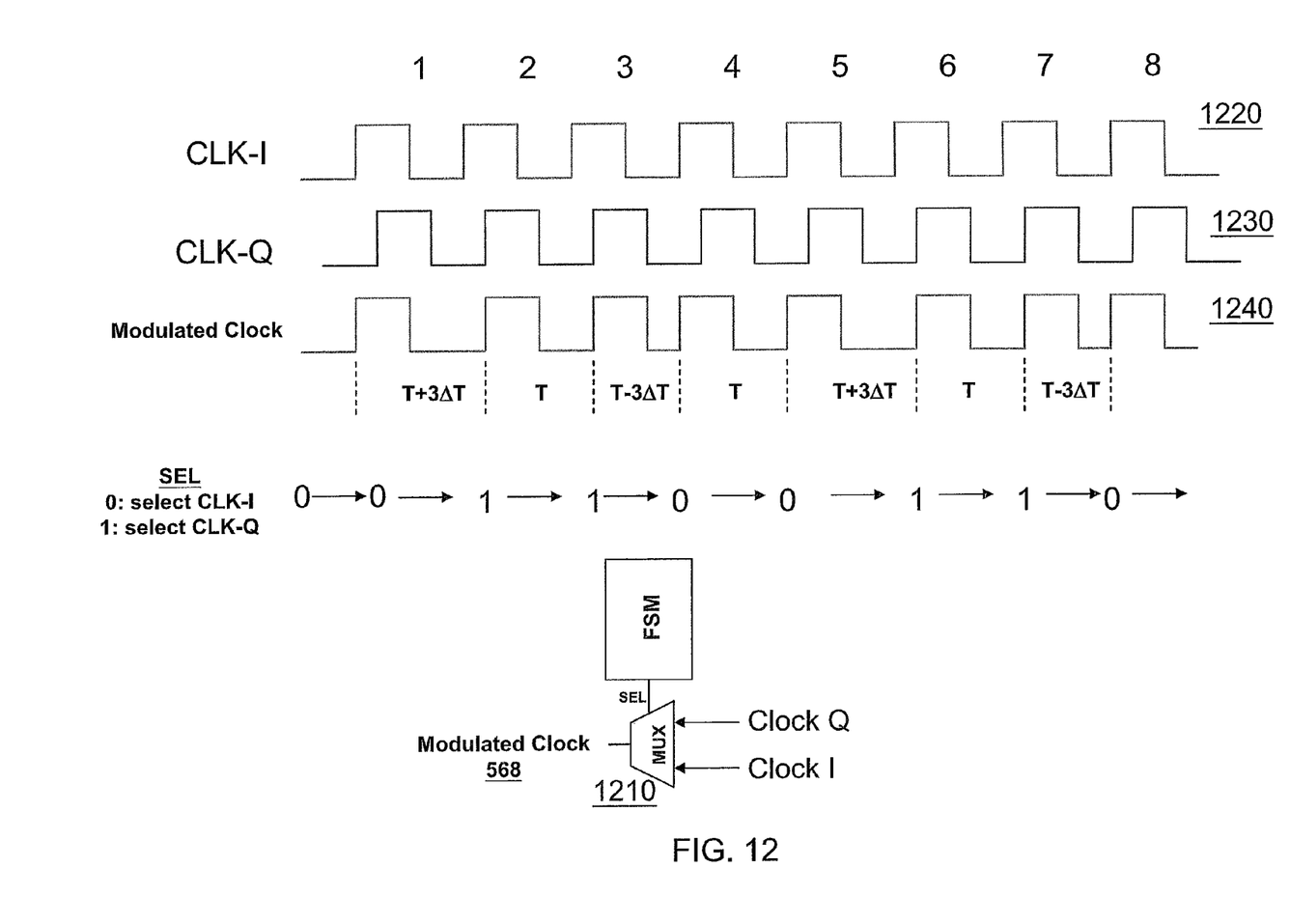
FIG. 12 illustrates a timing diagram of the two-bit finite state machine shown in FIG. 11.

FIG. 12 illustrates a timing diagram of a two-bit finite-state machine. In this example, there are two input signals Clock I 1220 and Clock Q 1230. They may be tapped off either from a delay chain or from the output of a phase interpolator. In this example, the phase shift between Clock I 1220 and Clock Q 1230 is 3 ΔT. When a logic state of SEL is "0", the multiplexer 1210 selects Clock I 1220. Likewise, the multiplexer 1210 selects Clock Q 1230 when SEL is "1". Modulated clock 1240 shows the jitter modulation based upon this two-bit finite-state-machine. Within one period of the counter shown in FIG. 11, the counter starts from "00" and counts "01", "11" and "10", and returns to "00", and repeats. The corresponding SEL changes from "0" to "0", "1" and "1" and returns to "0", and repeats. As shown in FIG. 12, the modulated clock 1240's phase shift changes from 0 to 3 ΔT, 0 and −3 ΔT and return to 0, and repeats. The phase shifts in one cycle form a sinusoidal envelope.

FIG. 11 illustrates a simple jitter modulation control signal based upon a two-bit finite state machine. In FIG. 3, the sinusoidal curve 306 shows more phase-shift steps within one sinusoidal period. If this is desired, an ordinary person in the art will recognize that this can be achieved by adopting a phase interpolator having multiple stages. As described above, a multiple stage phase interpolator is capable of generating a signal having a phase shift at any intermediate point between the two input signals. As shown in FIG. 6, a phase interpolator 640 having multiple stages requires multiple control signals. The multiple control signals can be generated by using a multiple-bit finite-state-machine.

Figure 13:
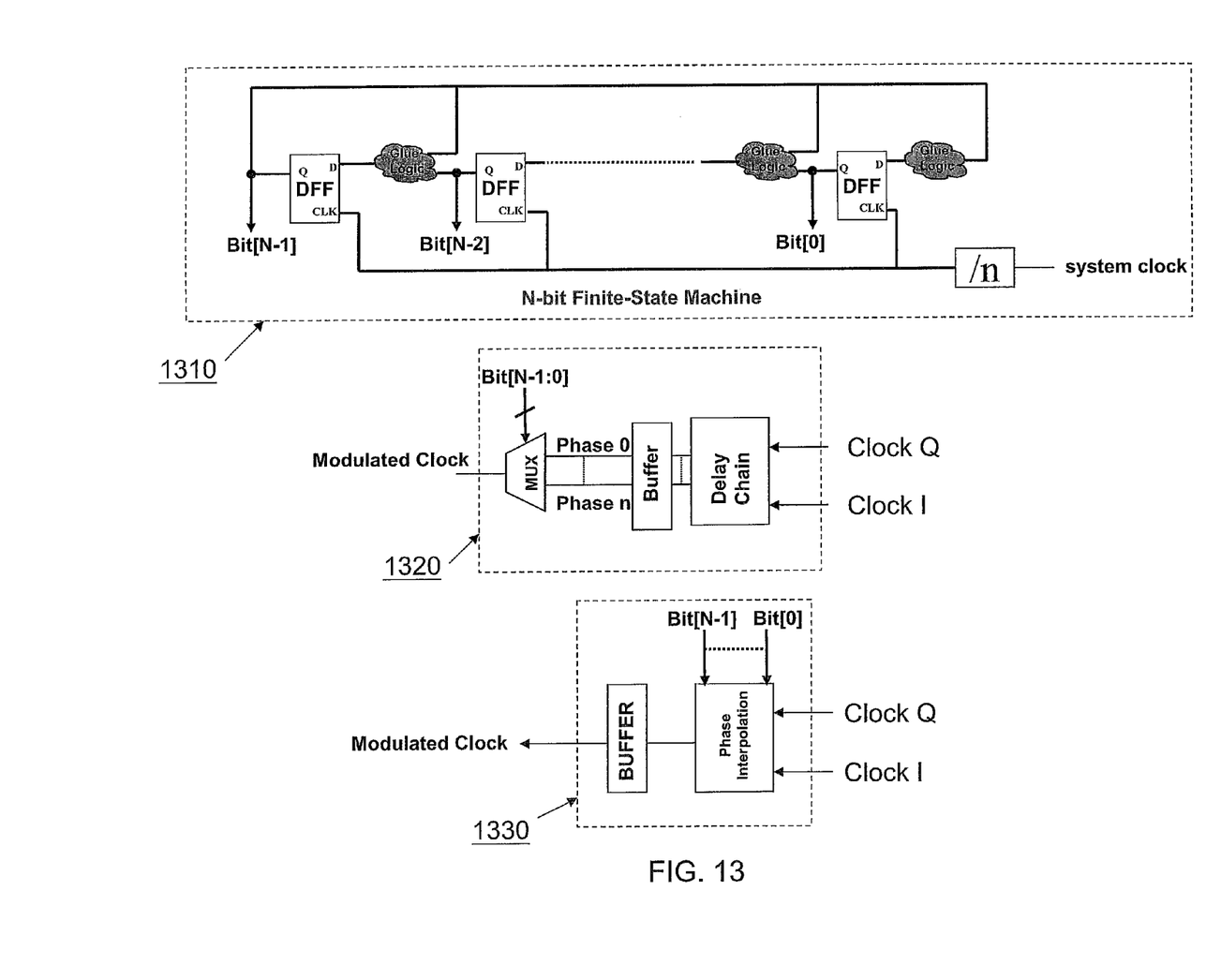
FIG. 13 illustrates a detailed circuit diagram of an N-bit finite-state-machine, an N-phase delay chain and an N-phase phase interpolator.

FIG. 13 illustrates a detailed circuit diagram of an N-bit finite-state-machine 1310, an N-phase delay chain 1320 and an N-phase phase interpolator 1330. The N-bit finite-state-machine 1310 includes N D flip-flops. The outputs of these N flip-flops form a group of control signals. From right to left, the control signals are referred to as Bit[ ], Bit[1], . . . , Bit[N−1]. In an embodiment, the control signals from the N-bit finite-state-machine 1310 are applied to the N-phase delay chain 1320. In accordance with the control signal applied to the N-phase delay chain, a signal is selected and transferred to the output as the modulated clock. In another embodiment, the control signals (Bit[ ] to Bit[N−1]) are applied to the N stages of the N-phase phase interpolator 1330. A modulated clock is selected in accordance with the control signals generated from the N-bit finite-state-machine 1310. By applying the principles described above, a built-in jitter modulation circuit not only provides a cost effective manner testing jitter tolerance, but also achieve a jitter modulated data signal having various phase shifts.

The present disclosure provides a method and apparatus to measure jitter tolerance of semiconductor devices. The built-in jitter modulation unit generates a jitter signal without using external test equipment and the jitter is used to alter the data signal by controlling the clock inputs of a variety of D flip-flops. The jitter contaminated data signal is fed into a comparison unit, wherein it is compared with the original data signal and the comparison unit sends a BIST flag indicating jitter tolerance of the semiconductor device. As a result, the present disclosure provides a cost-effective solution for testing jitter tolerance.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A built-in bit error rate test circuit comprising:
   a jitter modulation circuit having:
      a signal input for carrying a data signal;
      an output for generating a modulated data signal; and
      a control input for receiving a modulated signal from a multi-phase signal generator;
   the multi-phase signal generator having:
      a control input for receiving a control signal from a phase-select block, a plurality of signal inputs and an output coupled to the control input of the jitter modulation circuit; and
   the phase-select block having:
      a counter-based finite state machine; and
      a control signal output coupled to the control input of the multi-phase signal generator.

2. The built-in bit error rate test circuit of claim 1, wherein the jitter modulation circuit further comprises
   a first data latch having an input coupled to the signal input and a first data latch output;
   a second data latch having an input coupled to the first data latch output and a second data latch output;
   a third data latch having an input coupled to the second data latch output and a clock input coupled to the multi-phase signal generator; and
   a multiplexer coupled to a clock input of the first data latch and a clock input of the second data latch.

3. The built-in bit error rate test circuit of claim 2, wherein the first, second, and third data latch are each a D flip-flop.

4. The device of claim 2, wherein the multiplexer has a first input coupled to a system clock, and a second input coupled to a clock having a 180-degree phase shift from the system clock.

5. The device of claim 4, wherein the multiplexer selects the second input signal to indicate the device is under a jitter tolerance test.

6. The device of claim 2, wherein the third data latch receives the modulated signal from the multi-phase generator and generates a modulated data signal, and wherein the modulated data signal is in phase with the modulated signal.

7. The device of claim 1, further including a phase locked loop (PLL) ring oscillator having two outputs coupled to data inputs for the multi-phase signal generator.

8. The device of claim 7, wherein the PLL ring oscillator has five gates attached in a chain wherein an output of the last gate is fed back into an input of the first gate, outputs of two adjacent gates of the PLL ring oscillator being coupled to the multi-phase signal generator, and wherein an output of the last gate is used as the system clock.

9. The device of claim 1, wherein the multi-phase signal generator is a delay chain.

10. The device of claim 1, wherein the multi-phase signal generator is a phase interpolator.

11. The device of claim 1, wherein the phase-select block further comprises:
   a signal input for carrying a RESET signal;
   a first data latch;
   a second data latch;
   a first logic gate having a first input coupled to an output of the second data latch, a second input coupled to the RESET signal and an output coupled to a data input of the first data latch;

a second logic gate having a first input coupled to an output of the first data latch, a second input coupled to the RESET signal and an output coupled to an input of the second data latch; and a frequency divider for dividing the system clock by N and generating a slow clock signal, where N is an integer.

12. A method for testing jitter tolerance by using a built-in bit rate error test circuit comprising:

generating a plurality of signals having different phase shifts;

selecting a modulated clock signal from the plurality of signals in accordance with a selection signal given by a finite state machine;

altering a data signal and generating a modulated data signal by transmitting the data signal through a data latch where the data latch clocks the data signal with the modulated clock signal; and comparing the modulated data signal with the data signal.

13. The method of claim 12 further comprising transmitting the modulated data signal through a transmitter and a receiver.

14. The method of claim 12, wherein selecting a modulated clock signal from the plurality of signals in accordance with a selection signal given by a finite state machine further comprises:

generating a cyclical selection signal using a counter-based finite state machine; and selecting one of a plurality of phase shifted clock signals on the basis of the cyclical selection signal.

15. The method of claim 12, wherein selecting a modulated clock signal from the plurality of signals in accordance with a selection signal given by a finite state machine further comprises:

phase blending a first clock signal and a second clock signal in a first stage of a phase-select block; and phase blending an output of the first stage with either the first clock signal or the second clock signal in response to the selection signal given by the finite state machine.

16. The method of claim 15 further comprising:

phase blending an output of a plurality of stages with either the first clock signal or the second clock signal in response to the selection signal, wherein the selection signal is time varying.

17. A system for testing jitter tolerance comprising:

a transmitter configured as an I/O stage to receive a modulated data signal and configured to send the modulated data signal to a receiver by using a transmission medium;

the receiver configured to send the modulated data signal to a data comparator;

the data comparator configured to compare the modulated data signal with an original data signal; and a jitter modulator circuit; wherein the jitter modulation circuit further comprises:

a data latch chain;

a multi-phase clock generator receiving a control signal input from a phase-select block and having an output coupled to a clock input of the data latch chain; and the phase-select block having a counter based finite state machine, an input coupled to a system clock, and a first output coupled to a control signal input of the multi-phase clock generator.

18. The system of claim 17, further including a clock data recovery unit configured to extract clock information from the modulated data signal and to send extracted clock information to a decision circuit.

19. The system of claim 17, further including the decision circuit wherein the decision circuit retimes the modulated data signal.

20. The system of claim 17, wherein the data comparator compares the modulated data signal with the original data signal and sends a Built-In Self-Test (BIST) flag if an error between the original data signal and the modulated data signal exceeds a predetermined limit.

* * * * *